(12) United States Patent
Liu et al.

(10) Patent No.: US 11,271,557 B2
(45) Date of Patent: Mar. 8, 2022

(54) ADAPTIVE GATE DRIVER

(71) Applicant: SEMICONDUCTOR COMPONENTS INDUSTRIES, LLC, Phoenix, AZ (US)

(72) Inventors: Zhiwei Liu, Fremont, CA (US); Marc Dagan, Mountain View, CA (US); Xudong Huang, Fremont, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/946,755

(22) Filed: Jul. 6, 2020

(65) Prior Publication Data
US 2020/0336140 A1 Oct. 22, 2020

Related U.S. Application Data

(63) Continuation of application No. 16/582,955, filed on Sep. 25, 2019, now Pat. No. 10,720,915, which is a continuation of application No. 16/142,256, filed on Sep. 26, 2018, now Pat. No. 10,469,068.

(51) Int. Cl.
*H02M 1/08* (2006.01)
*H03K 17/687* (2006.01)
(Continued)

(52) U.S. Cl.
CPC .......... *H03K 17/0822* (2013.01); *H02M 1/08* (2013.01); *H02M 3/158* (2013.01);
(Continued)

(58) Field of Classification Search
CPC .. H03K 17/6871; H03K 17/6872; H02M 1/08
(Continued)

(56) References Cited

U.S. PATENT DOCUMENTS

| 6,459,325 | B1 * | 10/2002 | Hall | H03K 4/00 326/27 |
| 7,994,827 | B2 * | 8/2011 | Williams | H03K 17/18 327/110 |

(Continued)

OTHER PUBLICATIONS

U.S. Appl. No. 16/582,955, filed Sep. 25, 2019, Allowed.

*Primary Examiner* — Gary A Nash
(74) *Attorney, Agent, or Firm* — Brake Hughes Bellermann LLP

(57) ABSTRACT

An adaptive gate driver for a driving a power MOSFET to switch is disclosed. The adaptive gate driver includes a load sense circuit to sense a current through the power MOSFET. A controller coupled to the load sense circuit compares the sensed current to a threshold to determine if the load on the power MOSFET is a normal load or a heavy load. Based on the comparison, the controller controls the gate driver to drive the power MOSFET with a first strength level when a normal load determined and at second strength level when a heavy load is determined. The driving strength in the heavy-load condition is lower than the normal-load condition and by lowering the driving strength of the gate driver during the heavy-load condition a voltage across the power MOSFET may be prevented from exceeding a threshold related to a breakdown condition during a switching period.

20 Claims, 10 Drawing Sheets

(51) Int. Cl.
    *H03K 17/082*     (2006.01)
    *H02M 3/158*     (2006.01)
    *G05F 1/573*     (2006.01)
    *G05F 1/56*     (2006.01)
    *H02M 1/00*     (2006.01)

(52) U.S. Cl.
    CPC .............. *G05F 1/562* (2013.01); *G05F 1/573* (2013.01); *H02M 1/0009* (2021.05); *H03K 17/6871* (2013.01); *H03K 17/6872* (2013.01); *H03K 2217/0063* (2013.01); *H03K 2217/0072* (2013.01)

(58) Field of Classification Search
    USPC ................... 323/282, 289; 307/109; 327/109
    See application file for complete search history.

(56) References Cited

U.S. PATENT DOCUMENTS

| | | | | |
|---|---|---|---|---|
| 2010/0007320 | A1* | 1/2010 | Qiu .................... | H03K 17/6871 323/285 |
| 2012/0126765 | A1* | 5/2012 | Stone .................. | H02M 3/1588 323/283 |
| 2013/0278300 | A1* | 10/2013 | Domingo ............ | H03K 17/122 327/109 |
| 2015/0115911 | A1* | 4/2015 | Parto ................... | H02M 3/158 323/271 |
| 2015/0222172 | A1* | 8/2015 | Thakur ................ | H02M 3/155 323/311 |
| 2016/0329808 | A1* | 11/2016 | Han ..................... | H02M 3/158 |
| 2017/0141673 | A1* | 5/2017 | Naka ................... | H03K 17/165 |
| 2017/0222638 | A1* | 8/2017 | Gariboldi ............ | G05F 3/16 |

* cited by examiner

ADAPTIVE GATE DRIVER

CROSS-REFERENCE TO RELATED APPLICATION

This application is a continuation of U.S. patent application Ser. No. 16/582,955 filed on Sep. 25, 2019, which is a continuation of U.S. patent application Ser. No. 16/142,256 filed on Sep. 26, 2018. The entire contents of these applications are incorporated herein by reference.

FIELD OF THE DISCLOSURE

The present disclosure relates to power electronics and more specifically to a gate driver for driving a power MOSFET that has an adaptive driving strength to protect the power MOSFET from exceeding a threshold related to a breakdown voltage during switching in heavy-load conditions.

BACKGROUND

A gate driver circuit translates a logic signal to a switching signal with a voltage and a current that are suitable for driving a gate of a power metal-oxide-semiconductor field-effect transistor (MOSFET) to switch the power MOSFET between an on state and an off state. Gate drivers may be found in a variety of switch-mode power applications. For example, a switch-mode converter system (i.e., a power converter) that provides power to a microprocessor under load conditions that vary with time may use a plurality of gate drivers. More specifically, the power converter can include a high-side power MOSFET (HS-FET) and a low-side power MOSFET (LS-FET) that are switched by gate drivers to alternatively connect a storage element (e.g., an inductor) between an input voltage and a ground. Switching a power MOSFET with a fast switching speed in a heavy-load condition can lead to a voltage overshoot across the power MOSFET that creates a reliability concern.

SUMMARY

Accordingly, in one aspect, the present disclosure describes an adaptive gate driver for a power MOSFET. The adaptive gate driver includes a gate driver circuit that is connected to a gate of the power MOSFET and that electrically drives the gate to switch the power MOSFET between an on state and an off state. The adaptive gate driver also includes a load sense circuit that is configured to sense a current through the power MOSFET when the power MOSFET is switched to the on state. The adaptive gate driver further includes a controller that is coupled to the load sense circuit and to the gate driver circuit. The controller is configured to compare the current to a load threshold. If the current exceeds the load threshold, the controller lowers the driving strength of the gate driver circuit from a normal-load level to a heavy-load level as the power MOSFET transitions (i.e., is switched) from the on state to the off state. Lowering the driving strength during switching reduces the voltage ringing across the power MOSFET.

In another aspect, the present disclosure describes a switch-mode converter system. The system includes a high-side power MOSFET (HS-FET) that is coupled at its drain to an input voltage and that is coupled at its source to a load. The system also includes a load sense circuit that is configured to sense a current in the HS-FET when the HS-FET is in an on state and a controller that is coupled to the load sense circuit. Based on the sensed current provided by the load sense circuit, the controller can determine a load condition. The controller is coupled to a HS-FET gate driver circuit, which in turn, is coupled to the gate of the HS-FET. When the controller determines that the load condition, based on the sensed current, is a heavy-load condition, the controller configures the HS-FET gate driver circuit to lower its driving strength from a normal-load level to a heavy-load level during a switching period.

In another aspect the present disclosure embraces a method for driving a power MOSFET. The method includes sensing a current through a power MOSFET when the power MOSFET is switched to an on state by a gate driver circuit configured to drive a gate of the power MOSFET during a switching period. The sensed current is then compared to a load threshold in order to detect a heavy-load condition. Upon detecting the heavy-load condition, the gate driver circuit is controlled to reduce a driving strength from a normal-load level to a heavy-load level during the switching period.

The disclosed circuit, system, and method can be used to extend the switching period of a power MOSFET during heavy-load conditions in order to reduce a voltage ringing (i.e., voltage overshoot, voltage ripple) across the power MOSFET, which prevent the voltages across the power MOSFET from exceeding a threshold related to a breakdown voltage in a heavy-load condition. The switching period may be extended by lowering the electrical drive strength of a gate driver circuit during the switching period. In some embodiments, the gate driver circuit includes a large transistor and a small transistor that are connected in parallel to the gate of the power MOSFET, and the drive strength of the gate driver circuit can be lowered from a normal-load level to a heavy-load level during the switching period by turning off the large transistor.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
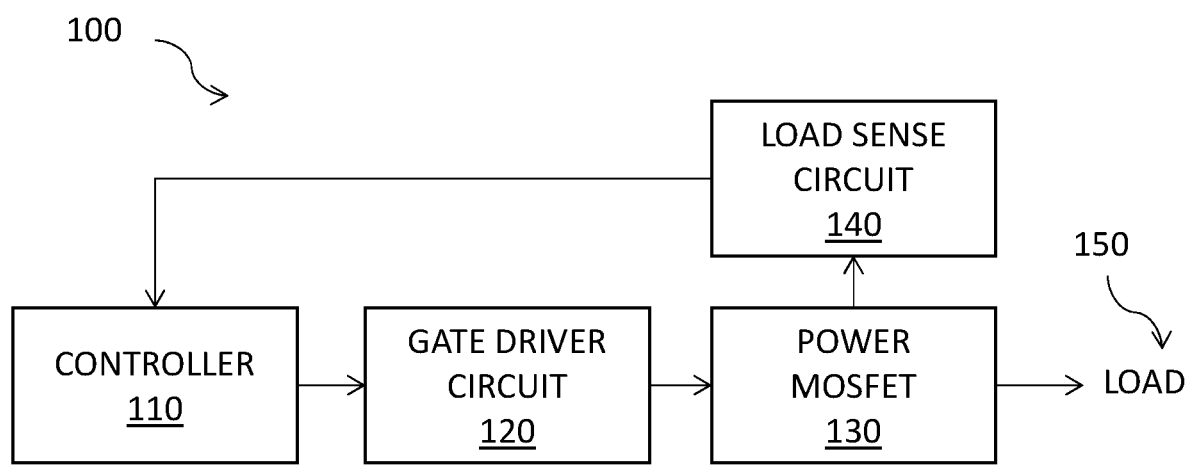
FIG. 1 is a block diagram of an adaptive gate driver for a power MOSFET according to an embodiment of the present disclosure.

The present disclosure describes a gate driver for a power MOSFET that can be controlled to provide a drive strength that is based on a load condition on the power MOSFET. The drive strength affects the duration of the transition the power MOSFET from one switch state (e.g., ON) to another (e.g., OFF), and a high drive strength level can switch the power MOSFET faster than a low drive strength level. Switching the power MOSFET quickly is efficient, however, fast switching is associated with high voltage (i.e., drain to source voltage, $V_{DS}$) ringing across the power MOSFET when the current levels switched by the power MOSFET are higher than a predetermined threshold (i.e., in a heavy-load condition). Accordingly, switching the power MOSFET quickly in a heavy-load condition may result in a voltage overshoot that exceeds a threshold related to a breakdown (i.e., avalanche) voltage of the power MOSFET.

The reliability of a circuit or system including the power MOSFET can be expressed by a mean-time-between failure metric. The mean-time-between-failure (MTBF) metric can be improved if the maximum voltage level across the power MOSFET is made lower than the maximum rated voltage by a voltage margin (e.g., 80% or more of the max rated voltage) and if a circuit driving the power MOSFET is configured to avoid exceeding this maximum voltage level across the power MOSFET during operation. Thus, the present disclosure describes a gate driver that is configurable to drive the switching of a power MOSFET differently in a heavy-load condition to avoid voltage ringing (i.e., voltage overshoot) that exceeds a threshold voltage related to the maximum voltage level described above.

For example, a switching regulator that provides power to a processor may utilize the adaptive gate driver to control the switching of a power MOSFET for operation. The power MOSFET may have a voltage rating of 30V. (note, the actual avalanche breakdown will vary according to normal manufacturing variations, but will exceed the voltage rating). To achieve an acceptable MTBF, it may be determined that the MOSFET should never experience a voltage greater than 80% of this voltage rating (i.e., a maximum voltage level across the power MOSFET=24 volts). Based on empirical data, it can be determined that the voltage ringing experienced by the power MOSFET exceeds this maximum voltage level when the current of the MOSFET exceeds 70 Amperes (A). Accordingly, a threshold may be set at or near (e.g., within 10%) 70 A and the current through the power MOSFET may be monitored during operation. When the current through the power MOSFET exceeds the threshold at or near 70 A, a heavy-load condition may be determined and the gate driver may be configured to switch the power MOSFET differently (i.e., slower) to avoid voltages (i.e., voltage ringing) that exceed the maximum voltage level.

The example above is provided to aid in understanding aspects (e.g., a heavy-load condition, voltage margin, etc.) of the present disclosure. While representative of a practical embodiment, the exact values of each of the parameters described above may vary based on the particular application, the particular circuit, and the particular operating conditions. The scope of the present disclosure covers all these variations.

One aspect of the present disclosure is related to reducing a drive strength of the gate driver when a heavy-load condition is detected. The lowered drive strength slows the switch speed of the power MOSFET to reduce the voltage stress (i.e., the voltage overshoot in the voltage ringing) on the power MOSFET. Thus, a power MOSFET rated with a relatively low breakdown voltage (i.e., a smaller power MOSFET) may be in applications that once required a MOSFET rated with a relatively high breakdown voltage. The advantages in cost savings, space savings, and reliable operation provided by the present disclosure are worth the small decrease in a switching efficiency during brief periods (also can be referred to as time periods) of heavy-load conditions for many applications. For example, the disclosed technique may be used in a switch-mode converter to reduce a voltage overshoot by 20%, while reducing the efficiency by only 1% or less only during the brief periods (e.g., time periods, microseconds) of a heavy-load condition.

Another aspect of the present disclosure is a gate driver that it includes two parallel connected (also can be referred to as coupled and/or electrically coupled) transistors that can act together or individually to drive the gate of the power MOSFET during switching. The two transistors typically can include a strong transistor (i.e., large transistor) and a weak transistor (i.e., small transistor) where the strength of the transistor is associated with transistor's ability to discharge the gate of the power MOSFET. Thus, a strong (i.e., large) transistor may have a lower resistance and may be able to drive a higher current than the weak (i.e., small) transistor due to a larger gate width. When the large transistor and the small transistor are both turned ON they each begin to drain charge from the gate capacitor of the power MOSFET. If they both remain ON, the gate of the power MOSFET is discharged (e.g., quickly discharged) and switched OFF. If, during the discharge process, the large transistor is turned OFF, then the gate of the power MOSFET will be discharged slower and the time taken to switch the power MOSFET OFF will be extended.

Another aspect of the present disclosure is providing switching signals to the two parallel connected transistors that depend on the load condition of the power MOSFET. For example, if a normal-load condition is detected, then a step signal may be provided to the gates of the large transistor and the small transistor so that the transistors operate together to quickly switch the power MOSFET. If a heavy-load condition is detected, however, then a step signal may be provided to the gate of the small transistor and a pulse signal may be provided to the gate of the large transistor. In other words, in a heavy-load condition, switching the power MOSFET may begin by discharging its gate capacitance using both the small transistor and the large transistor, but then turning OFF the large transistor before the switching transition is completed to slow the switching time and reduce ringing. The timing of the pulse can be determined by the properties of the power MOSFET. For example, the pulse may turn OFF the large transistor at approximately (e.g., less than a nanosecond difference) the start of the Miller plateau region of the gate source voltage ($V_{GS}$) during switching because this region is where the discharge of the gate capacitance of the power MOSFET most affects the magnitude of the resultant voltage ringing.

In other words, by turning OFF the large transistor at approximately the start of (or during) the Miller plateau region this region of the switch transition may be extended. In practice, the duration of the pulse (i.e., the duration the large transistor's part in switching the power MOSFET) may be less than 5 nanoseconds (nsec).

A block diagram of an adaptive gate driver for switching a power MOSFET is shown in FIG. 1. The adaptive gate driver 100 functions to change the power MOSFET from an on state to an off state and vice versa. When the power MOSFET is in an on state, the power MOSFET can connect a source to a load 150. The load 150 may change over time. For example, when connected at a first time the load may draw a first current and when connected at a second time the load may draw a second current from the load. Thus, the current through the power MOSFET may change with time as the power MOSFET is switched on/off/on. In many applications, the load (e.g., a processor) operates primarily in a normal-load condition with occasional periods of heavy-load conditions, in which the current drawn by the load is higher than in the normal-load condition. The adaptive gate driver may detect the operating condition by sensing a current through the power MOSFET using a load sense circuit 140.

The load sense circuit 140 receives an input signal (e.g., a voltage or a current) associated with the power MOSFET 130 and creates a sensed current signal (e.g., a voltage or a current) representing the current through the power MOSFET when the power MOSFET is in an on state. The sensed current signal from the load sense circuit 140 is received at a controller 110.

The controller 110 is configured to compare the sensed current signal to a load threshold stored in a memory coupled to the controller. For example, if the sensed current signal exceeds the load threshold then a heavy-load condition is determined; otherwise a normal-load condition is determined. The load threshold is typically based empirical operating characteristics of the power MOSFET in various load conditions. The load threshold is typically fixed but may be adjustable for some purposes (e.g., accommodate changes in the power MOSFET and/or load). The output of the controller may include a plurality of control signals that are based on the determined load condition and/or the device characteristics (e.g., gate capacitance) of the power MOSFET 130. The control signals output from the controller 110 are received at a gate driver 120.

The gate driver 120 includes switching devices. The switching devices may be complementary metal oxide switches (e.g., N-type MOSFET (NMOS) device, P-type MOSFET (PMOS) device) that are typically configured as an inverter with its output connected to a gate of the power MOSFET 130. The inverter can be controlled by the switching signals to source or sink current depending on its state. For example, when the controller 110 provides a high control signal, the inverter may drive (i.e., pull-down) the gate of the power MOSFET low to drain current from the gate. Alternatively, when the controller 110 provides a low control signal, the inverter may drive (i.e., pull-up) the gate of the power MOSFET 130 high to provide current to the gate. The current to/from the gate of the power MOSFET 130 provides the charging/discharging of the gate capacitance required for switching the state of the power MOSFET from an on state to an off state and vice versa.

Figure 2:
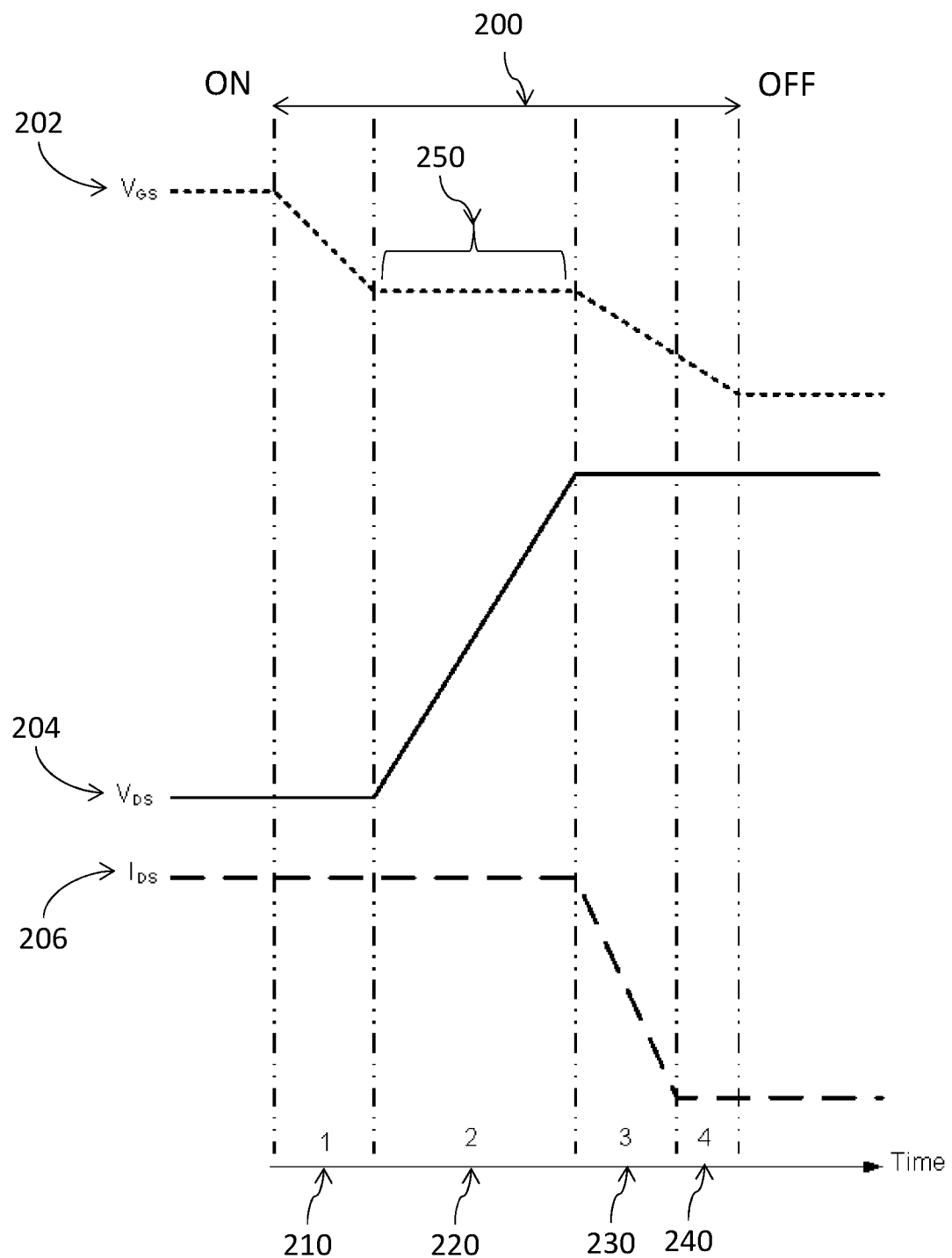
FIG. 2 depicts voltages and currents of a power MOSFET during a switching period according to an embodiment of the present disclosure.

An on-to-off (i.e., turn-off) transition of a power MOSFET (e.g., an n-channel enhancement-mode power MOSFET) during a switching period 200 (also can be referred to as a switching time period) is shown in FIG. 2. During a first time interval 210 of the switching period 200, the input capacitance ($C_{GS}$) of the power MOSFET is discharged to a Miller plateau level. As a result, the gate source (i.e., overdrive) voltage ($V_{GS}$) 202 is reduced while the drain-source current ($I_{DS}$) and drain-source voltage ($V_{DS}$) 204 remains relatively unchanged in the on state.

During the second time interval 220 of the switching period 200, the gate-source voltage ($V_{GS}$) 202 remains relatively constant in at what is known as a Miller plateau voltage 250. This region is known as the Miller plateau region 220, and here the drain-source voltage ($V_{DS}$) 204 rises, the drain-source current continues to flow, and the gate source voltage ($V_{GS}$) becomes constant as the Miller gate-drain capacitance ($C_{GD}$) is discharged, rather than the gate-source capacitance ($C_{GS}$).

In the third time interval 230 of the switching period 200, the drain source current $I_{DS}$ 206 is turned off (i.e., decreases to zero amperes), and the gate voltage $V_{GS}$ 202 resumes falling from the Miller plateau voltage to a threshold voltage ($V_{TH}$). In this third time interval 230, the remainder of the gate charge is drained from the gate source capacitor ($C_{GS}$), because the gate-drain capacitance ($C_{GD}$) was discharged during the previous time interval. In other words, the MOSFET is in the saturation region operation in the third time interval 230 and the declining gate-source voltage ($V_{GS}$) 202 causes the drain source current ($I_{DS}$) to decrease to zero amperes by the end of the third time interval 230. Meanwhile, the drain source voltage reaches a steady voltage, $V_{DS}$, for the off state of the power MOSFET.

In the fourth time interval 240 of the switching period 200, the input capacitance of the device is fully discharged. In the fourth time interval 240, the drain source current and the drain source voltage do not change. The gate source voltage ($V_{GS}$) 202 is further reduced until it reaches zero volts (V). As in the third time interval 230, a large portion of the gate current in the fourth time interval 240 is supplied by the gate source capacitor ($C_{GS}$).

The voltages and current of the power MOSFET shown in FIG. 2 are for a power MOSFET transitioning from an on state to an off state. Voltages and currents of the power MOSFET for a transition from an off state to an on state follow the same (or similar) time intervals, but in a reverse order. Additionally, the time intervals have complementary descriptions, such as charging capacitances rather than discharging capacitances.

The switching period for this transition can be fast. For example, the switching period in example embodiments may be less than 20 nanoseconds (nsec) with a first time of about 5 nsec. The drain source voltage ($V_{DS}$) in FIG. 2 is idealized, having no voltage overshoot (i.e., ringing) as a result of the power MOSFET's transition from an on state (i.e., a low $V_{DS}$) to an off state (i.e., a high $V_{DS}$). In practice, the capacitances, described above, combine with parasitic inductances to add a voltage ringing to the drain-source voltage (i.e., $V_{DS}$) as a result of switching. The parasitic inductances typically vary with the package of the power MOSFET, the layout of the power MOSFET, and/or external circuits and components connected to the power MOSFET. The effects of the parasitic inductances are typically more pronounced effect during a heavy-load condition. When the voltage ringing includes a voltage overshoot that exceeds the avalanche (i.e., breakdown) voltage of the power MOSFET, changes in operation (e.g., voltage clipping) results. Additionally, a voltage breakdown can introduce phenomena (e.g., impact ionization leading to charge injection) that may reduce the reliability of the power MOSFET over time.

To prevent voltage breakdown, a power MOSFET is typically selected with a breakdown voltage that exceeds the largest expected voltage overshoot. This selection provides an over-voltage margin to insure safe operation but may require the use of a much larger power MOSFET than needed for normal-load conditions. As the normal-load conditions are much more common than the heavy-load conditions, this approach is inefficient. The present disclosure describes an alternative to this approach by reducing voltage ringing during heavy-load conditions. This alternative approach offers the advantage of preventing a voltage breakdown while using a smaller and less expensive power MOSFET that has a lower breakdown voltage. Alternately, this approach may allow a MOSFET to operate at higher transient load currents or higher supply voltages than was previously practical.

Figure 3:
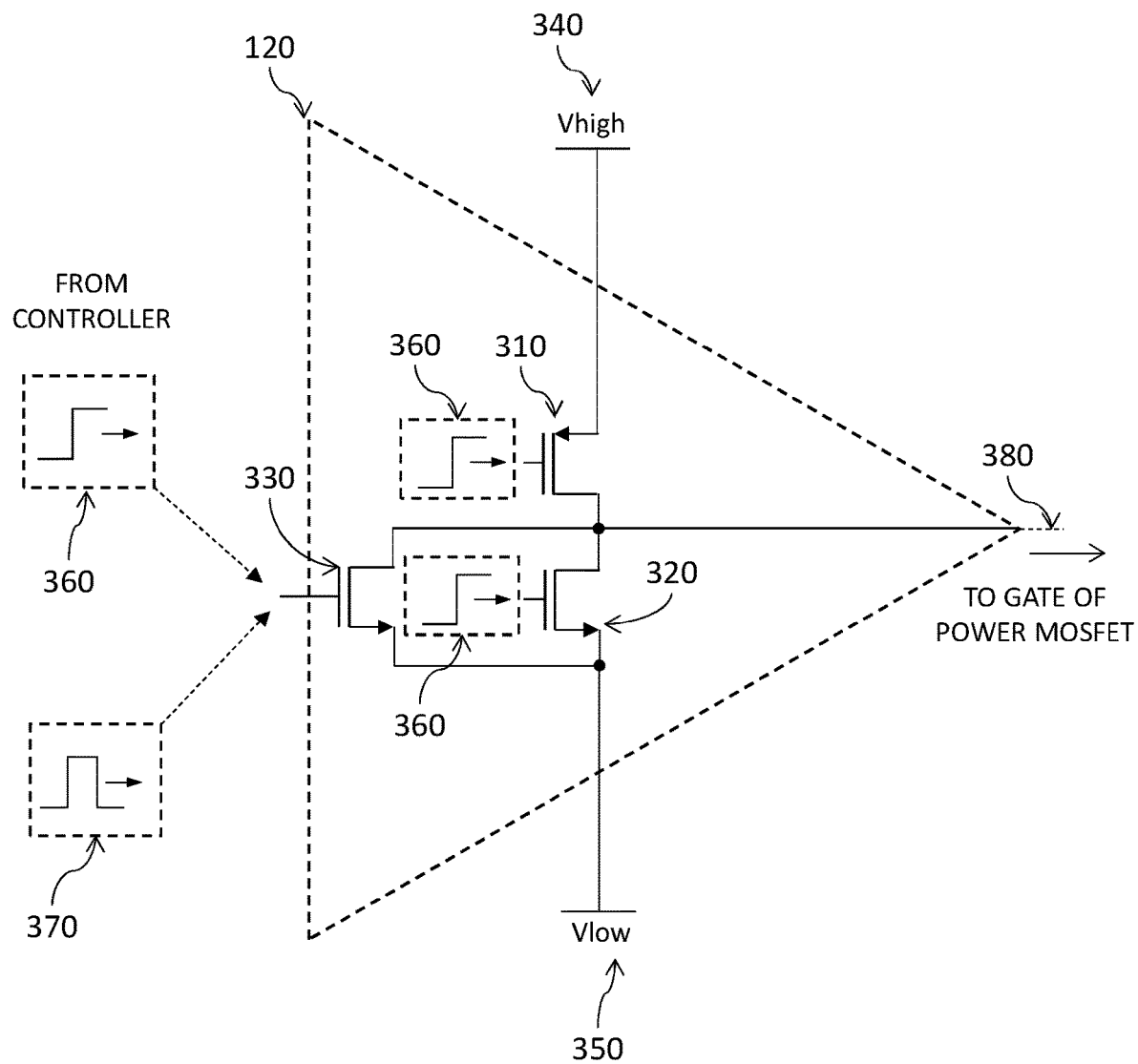
FIG. 3 is a schematic of a gate driver circuit for a power MOSFET according to an embodiment of the present disclosure.

A gate driver circuit 120 that helps to prevent a voltage breakdown (or exceeding a threshold related to a voltage breakdown) in a power MOSFET during heavy-load conditions is shown in FIG. 3. The gate driver receives digital switching signals from the controller 110. The switching signals configure switching transistors within the gate driver circuit 120 to connect the output 380 to either a high voltage ($V_{high}$) 340 or a low voltage ($V_{low}$) 350. The output of the gate driver circuit is connected to a gate of a power MOSFET 130 and therefore is able to source or sink the current from the gate to efficiently switch the power MOSFET as shown in FIG. 2. The gate driver circuit includes a p-type metal oxide semiconductor (PMOS) transistor 310 and a first n-type metal oxide semiconductor (NMOS) transistor 320 configured as an inverter. The controller 110 provides the PMOS transistor 310 and the first NMOS transistor 320 both a step signal 360 to switch the power MOSFET. When the step signal transitions from low-to-high the first NMOS transistor 320 is switched to an on state (and the PMOS transistor 310 is switched to an off state). The first NMOS transistor 320 in the on state pulls the gate of the power MOSFET low, which switches the power MOSFET 130 to an off state. When the step signal transitions from high-to-low the PMOS transistor 310 is switched to an on state (and the first NMOS transistor 320 is switched to an off state). The PMOS transistor 310 in the on state pulls the gate of the power MOSFET high, which switches the power MOSFET 130 to an on state.

The gate driver further includes a second NMOS transistor 330 that is connected in parallel with the first NMOS transistor 320. The first and second NMOS transistor may be sized (e.g., channel width, W/L, etc.) the same (or substantially similar), but in some embodiments, the size of each transistor may be different. For example, the first NMOS transistor may be a small transistor that is capable of conducting less current than the second NMOS transistor.

As previously discussed, switching the power MOSFET efficiently requires charging/discharging capacitances associated with the power MOSFET. The driving strength of the gate driver 120 corresponds to the amount of current that can be conducted to/from the gate of the MOSFET and affects the switching speed of the power MOSFET. Thus, when the first NMOS 320 and the second NMOS 330 operate together more charge can be drained from the gate of the power MOSFET over a period (i.e., higher current) than when either the first NMOS 320 or the second NMOS 330 operate alone. Accordingly, by controlling the on/off state of the second NMOS 330 while the first NMOS 320 is in an on state, the driving strength of the gate driver may be adjusted between one of two levels.

Figure 4:
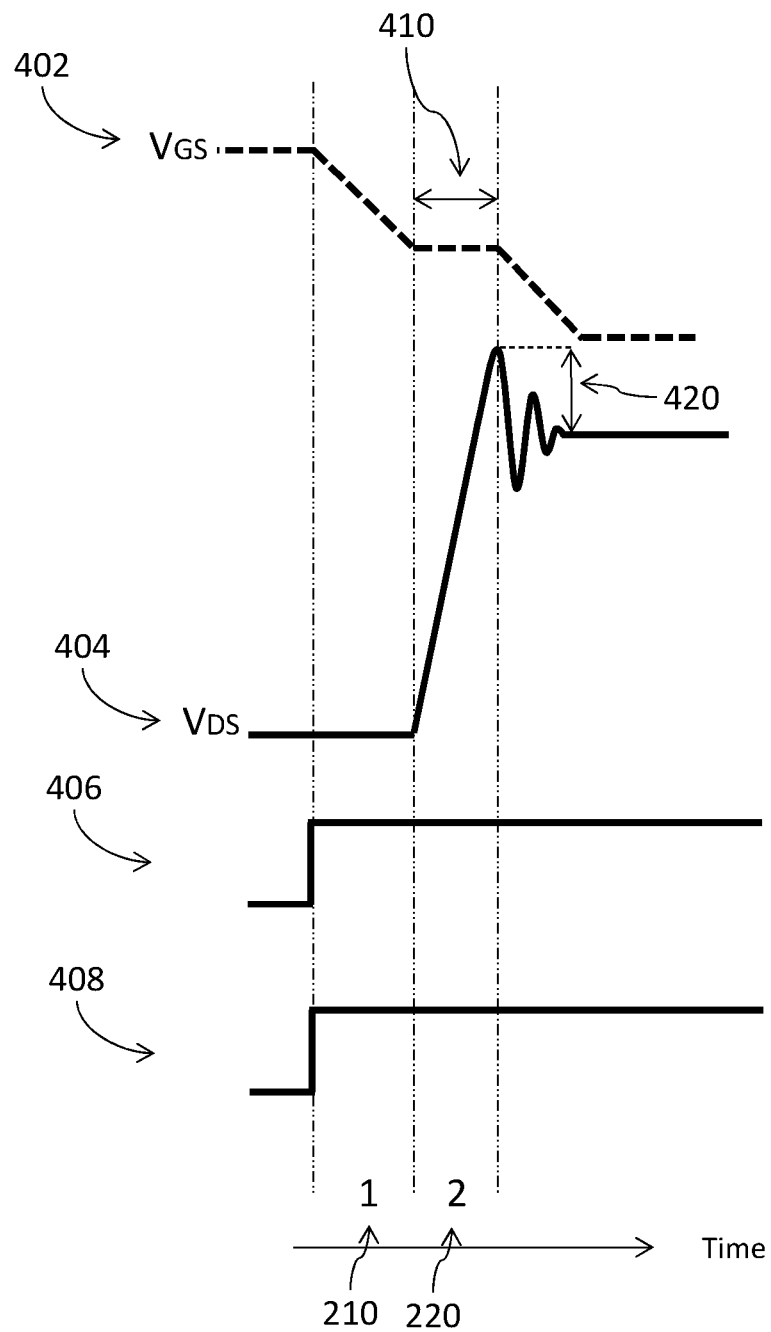
FIG. 4 depicts an example of switching signals of the gate driver circuit and voltages of the power MOSFET during a switching period in which the driving strength of the gate driver circuit is the same throughout the switching period.

Voltages of a power MOSFET during a switching period in which the first and second NMOS transistors operate together is shown in FIG. 4. In FIG. 4, the first time interval 210 and the second time interval 220 (i.e., the Miller plateau region) of the switching period are shown and operate as described in FIG. 2. The drain source voltage ($V_{DS}$) transitions during the Miller plateau region 410 of $V_{GS}$ and includes a voltage overshoot 420 due to voltage ringing in the transition of $V_{DS}$ from a low voltage (power MOSFET is in an on state) to a high voltage (power MOSFET is in an off state). FIG. 4 illustrates the switching signals provided from the controller to the gate driver to drive the gate of power MOSFET during switching. In particular, FIG. 4 shows a first switching signal 406 provided to the first NMOS transistor 320 and a second switching signal 408 provided to the second NMOS transistor.

Figure 5:
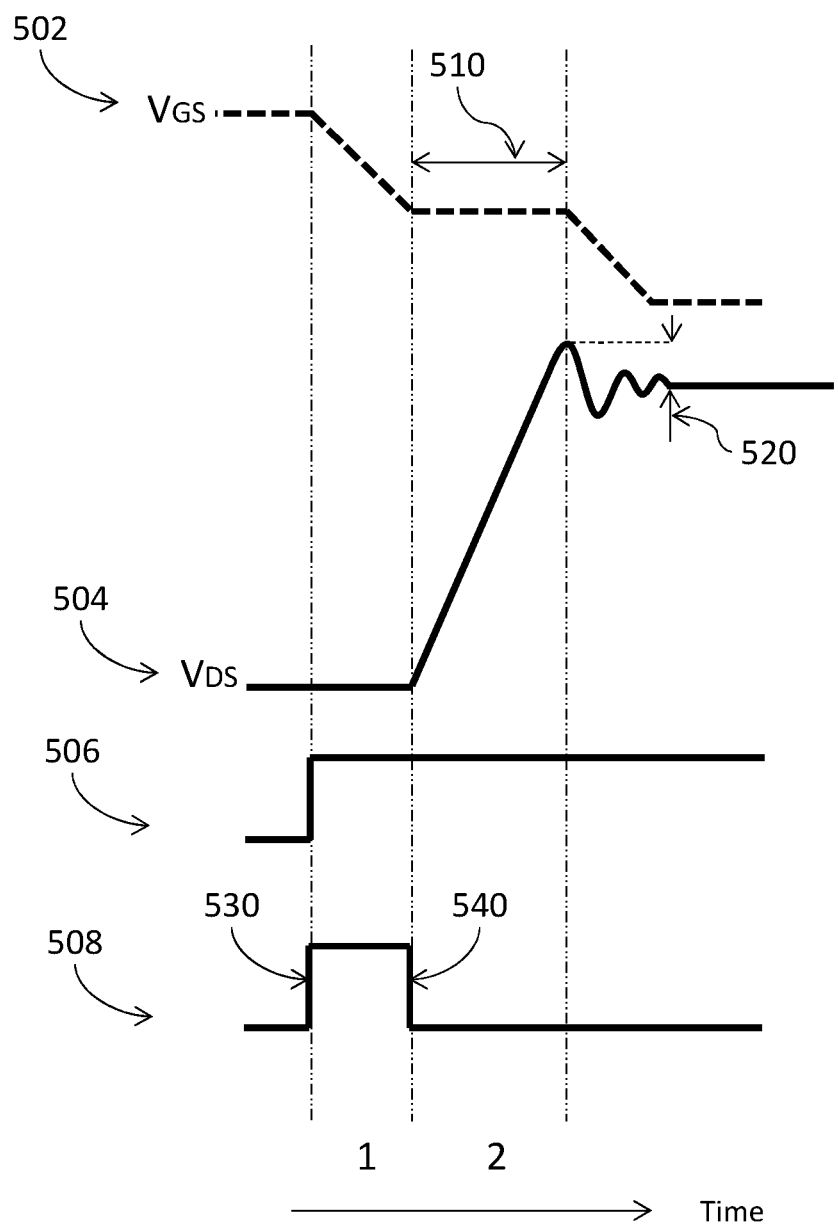
FIG. 5 depicts an example of switching signals of the gate driver circuit and voltages of the power MOSFET during a switching period in which the driving strength of the gate driver circuit is the reduced during the switching period.

For comparison, voltages of a power MOSFET during a switching period, in which the second NMOS is turned off, are shown in FIG. 5. FIG. 5 illustrates the switching signals provided from the controller to the gate driver to drive the gate of power MOSFET during switching. As shown a first switching signal 506 provided to the first NMOS transistor 320 and a second switching signal 508 provided to the second NMOS transistor. By turning the second switching signal off (i.e., by applying a pulse signal), the driving strength of the gate driver can be reduced during the Miller plateau region 510. This reduction of driving strength has the effect of extending the Miller plateau region 510 as compared to the Miller plateau region 410 shown in FIG. 4. Likewise, the reduction of driving strength has the effect of slowing the switching speed of the voltage ($V_{DS}$) across the power MOSFET. Slowing the switching speed reduces the voltage overshoot 520 (i.e., voltage ringing) across the power MOSFET as compared to the voltage overshoot 420 shown in FIG. 4.

The pulse applied to the second NMOS transistor (e.g., the large NMOS transistor) has a rising edge 530 at the start of the switching period and a falling edge 540 that occurs at a time corresponding to (e.g., at approximately the start of) the Miller plateau region 510 of the switching period. The falling edge 540 may occur at approximately (e.g., less than a nanosecond difference) the start of the Miller plateau region 510 or at some time during the Miller plateau region 510.

The gate driver may drive the power MOSFET to switch with one of two driving strength levels that correspond to the state of the second NMOS transistor. For example, when a normal-load condition is determined (e.g., by the load sense circuit) a step signal is applied to the first NMOS transistor (e.g., the small transistor) and a step signal (e.g., the same (or substantially similar) step signal) is applied to the second NMOS transistor (e.g., the large transistor) to provide a normal-load level driving strength. When a heavy-load condition is determined (e.g., by the load sense circuit) a step signal is applied to the first NMOS transistor (e.g., the small transistor) and a pulse signal is applied to the second NMOS transistor (e.g., the large transistor) to provide a heavy-load level driving strength. By extending the switching period (e.g., a time of the Miller plateau region) during (brief) heavy-load conditions, the switching efficiency is reduced (slightly) to reduce the voltage stress (e.g., voltage ringing) on the power MOSFET.

Figure 6:
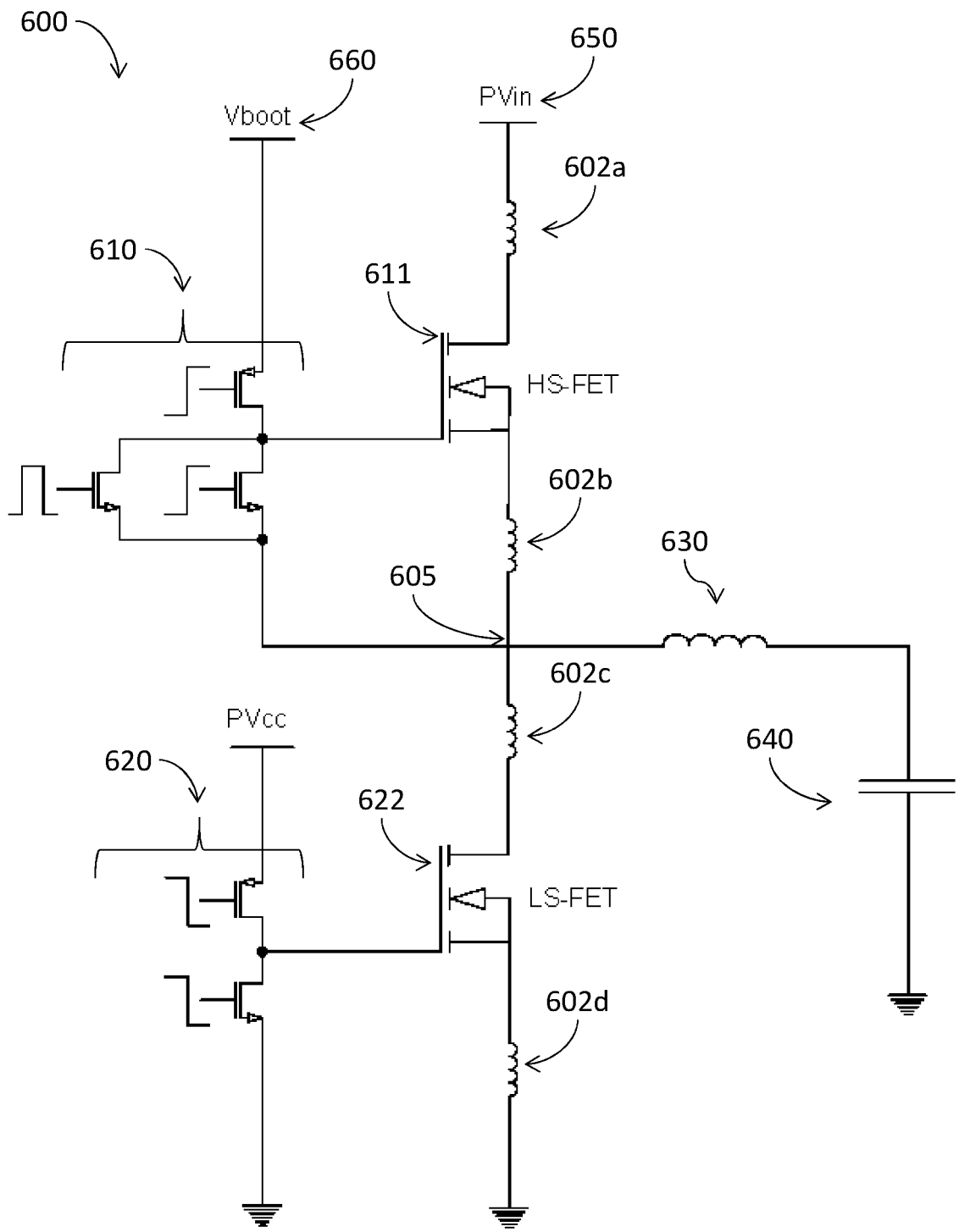
FIG. 6 is a schematic of a portion of a switch-mode converter system according to an embodiment of the present disclosure.

The adaptive gate driver may be used in a variety of switch-mode converter systems. As shown in FIG. 6, the adaptive gate driver 610 (i.e., HS-FET gate driver circuit) may be used to drive a high-side power MOSFET 611 (i.e., HS-FET) in a synchronous buck converter 600 that also includes a low-side power MOSFET 622 (i.e., LS-FET) driven by its own gate driver 620. The HS-FET 611 and the LS-FET 612 are switched (i.e., at a switching frequency) by the gate drivers to alternatively connect an output inductor 630 to an input voltage (PVin) 650 and ground. The output inductor 630 may also be connected in series with a capacitor 640 (or bank of capacitors), which can provide a filtering aspect to the synchronous buck converter. A load (e.g., processor, not shown) that receives power from the synchronous buck converter may be connected in parallel with the capacitor 640.

The HS-FET 611, shown in FIG. 6, is connected at its drain to the input voltage (PVin) 650 and at its source to a switch node 605. The drain and the source are also connected to parasitic inductances 602a, 602b, which are partially responsible for voltage ringing during switching. The HS-FET 611 is connected to an adaptive gate driver circuit (i.e., HS-FET gate driver circuit) 610. The adaptive gate driver is configured by switching signals from a controller to pull-up the gate voltage of the HS-FET to a bootstrap voltage ($V_{boot}$) 660 or pull-down the gate voltage of the HS-FET to the switch node voltage 605. The bootstrap voltage ($V_{boot}$) 660 is a floating voltage at a voltage that is higher than the voltage of the switch node 605.

The LS-FET 622, shown in FIG. 6, is connected at its drain to the switch node 605 and at its source to ground. The drain and the source are also connected to parasitic inductances 602c, 602d, which are partially responsible for voltage ringing during switching. The LS-FET is connected to a LS-FET gate driver circuit 620. For the embodiment shown in FIG. 6, the LS-FET gate driver does not include the second (i.e., large) NMOS transistor for adjusting of the driving strength because the voltage ringing across the LS-FET during switching does not cause a potentially harmful voltage overshoot. The LS-FET gate driver circuit 620 is configured by switching signals form a controller to pull up the gate voltage of the HS-FET to a switch node voltage 605 or pull down the gate voltage of the HS-FET to ground.

While FIG. 6 illustrates one possible embodiment, the scope of the present disclosure includes variations. For example, if the switch-mode converter system determines that the output voltage is too high and tries to reduce it quickly current from the output capacitor 640 is drawn back through the output inductor 630 and is boosted out the PVin terminal into storage caps on the PVin supply. In this case, a driver circuit with a first NMOS and a second NMOS may be used for the LS-FET to prevent voltage stress on the LS-FET.

Figure 7:
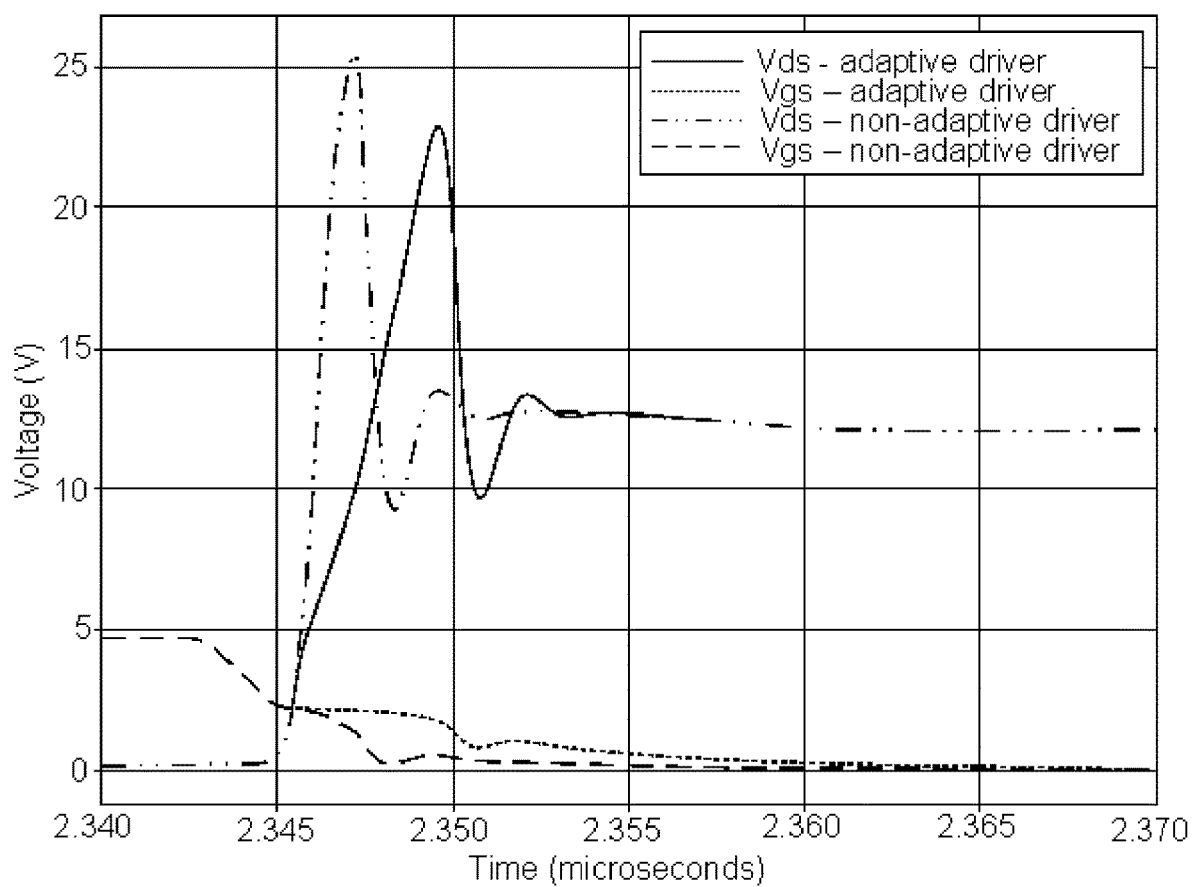
FIG. 7 depicts simulated voltages of the HS-FET of FIG. 7 during a switching period with and without an adaptive driver.

Voltages in the HS-FET (for the embodiment shown in FIG. 6) during an on-to-off switching period are shown in FIG. 7. As shown, switching the HS-FET with an adaptive gate driver, rather than with a non-adaptive gate driver, extends the Miller plateau region of the gate source voltage ($V_{GS}$) from about 2 nanoseconds to about 5 nanoseconds. The adaptive gate driver turns both the small NMOS transistor and the large NMOS transistor to an on state at the start of the switching period (i.e., 2.340 microseconds) and turns off the large NMOS transistor at a time corresponding to (e.g., during) the Miller plateau region. Accordingly, for the first 5 nanoseconds of the switching period the gate-source voltages for both the adaptive and non-adaptive driver cases are identical. The extension of the Miller plateau region of $V_{GS}$ using the adaptive gate driver corresponds to a voltage across the HS-FET ($V_{DS}$) that transitions from a low voltage (on state of HS-FET) to a high voltage (off state of HS-FET) in about twice the time. The slower switching time corresponds to a lower voltage overshoot in the voltage ringing across the HS-FET. As shown in FIG. 7, for a non-adaptive driver this voltage is more than 25 volts, while for an adaptive driver this voltage is about 23 volts. It should be noted that FIG. 7 is presented by way of example; the ranges and values may be different (e.g., larger or smaller) in other embodiments or implementations.

Figure 8:
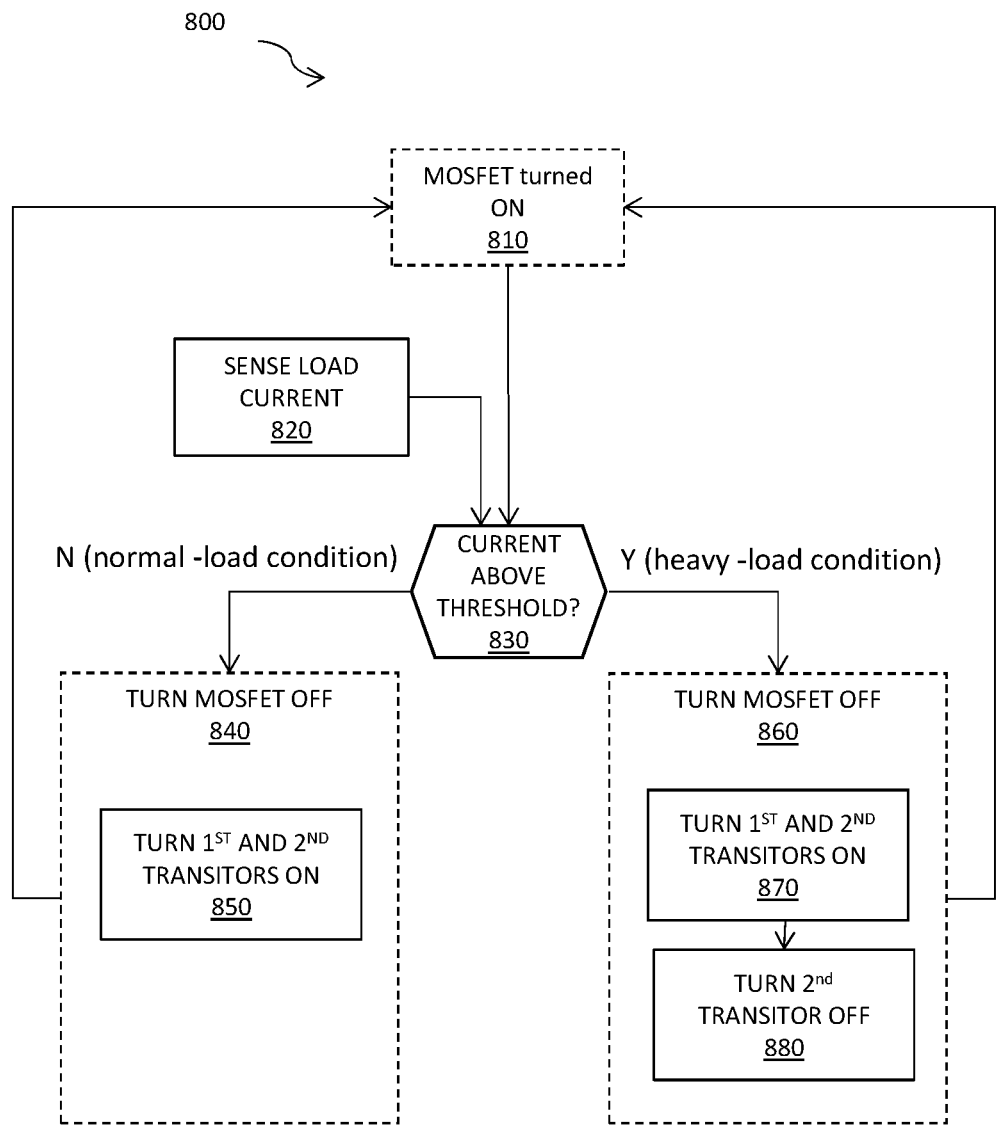
FIG. 8 is a flow chart of a method for driving a power MOSFET according to an embodiment of the present disclosure.

A flow chart of one possible method for driving a power MOSFET is shown in FIG. 8. Beginning with a power MOSFET in an on state 810, the method 800 begins by sensing current provided to a load. The load current may be sensed in a variety of ways. The load current may be sensed as a voltage or a current associated with the power MOSFET. The load current may be sensed in real time or may be derived as an expected current based on prior sensing. For the synchronous buck converter shown in FIG. 6, the load current may be sensed as a current in the output inductor 630, as a current through the HS-FET 611, or as a current in the LS-FET 622 at an earlier time (e.g., when the LS-FET is in an on-state). The sensed current is then compared 830 to a load threshold. If the sensed current is below the threshold (i.e., the power MOSFET is in a normal-load condition) then the gate driver circuit is controlled to turn the first transistor and the second transistor to an on state 850 with a step signal. The first and second transistors in the on state provide a driving strength at a normal-load level to turn the MOSFET off 840. If the sensed current is above the threshold (i.e., the power MOSFET is in a heavy-load condition) then the gate driver circuit is controlled to switch the first and second transistor to an on state 870 (i.e., at the start of the switching period) and then switching the second transistor to an off state 880 a time during the switching period (i.e., at or during a Miller plateau regions of $V_{GS}$ of the power MOSFET). The first and second transistors begin to switch the power MOSFET to an off state and then switching the power MOSFET to an off state 860 is finished by the first transistor alone. This process 800 may be repeated many times in a switch-mode device.

Figure 9:
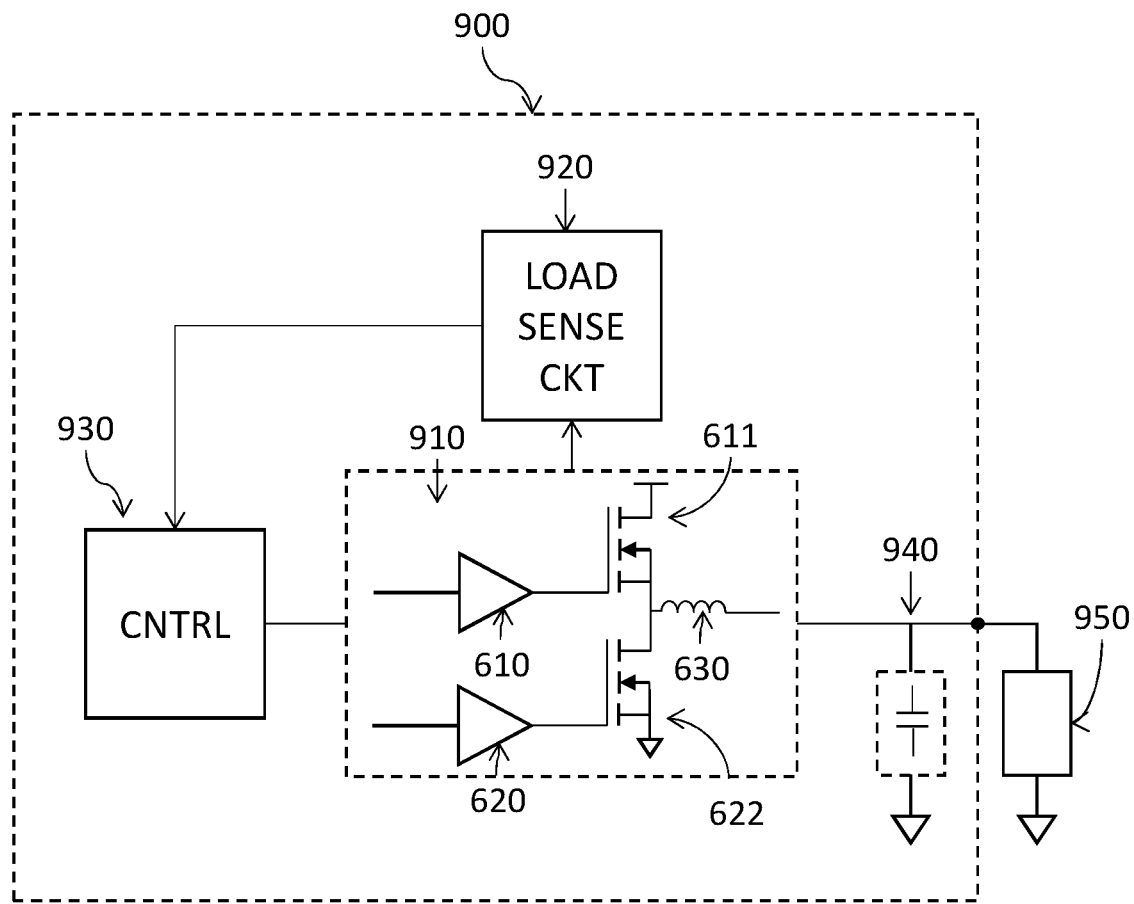
FIG. 9 is a schematic of a switch-mode converter system according to an embodiment of the present disclosure.

As shown in FIG. 9, a synchronous buck converter with an adaptive HS-FET gate driver circuit 910 may be combined with a load sense circuit 920, a controller 930, and (in some embodiments) a capacitor (bank) 940 to form a power stage 900 for providing regulated and/or converter power to a load 950.

Figure 10:
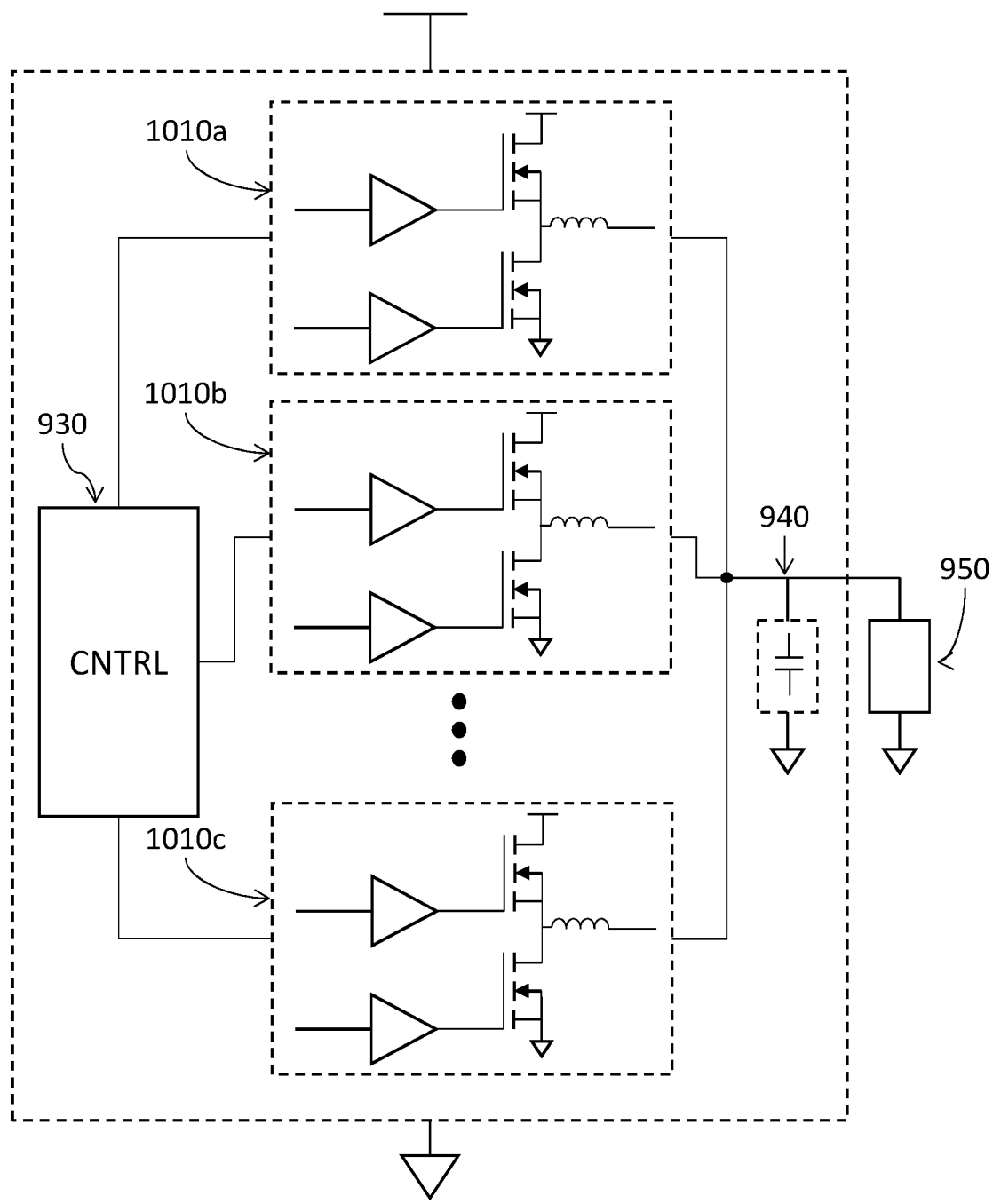
FIG. 10 is a schematic of a multiphase switch-mode converter system according to an embodiment of the present disclosure.

As shown in FIG. 10, an array synchronous buck converters 1010a, 1010b, 1010c, each with adaptive HS-FET gate driver circuits, may be combined with a load sense circuit (not shown), a controller 930 and (in some embodiments) a capacitor (bank) 940 to form a multiphase power stage for providing regulated multiphase power to a load 950.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A gate driver circuit comprising:
a source circuit including:
a source transistor that can be configured to conduct an ON current from a high voltage to an output; and
a sink circuit including:
a first sink transistor directly coupled between the output and a ground that can be configured to conduct a first OFF current from the output to the ground, and
a second sink transistor directly coupled between the output and the ground that can be configured to conduct a second OFF current from the output to the ground, a drive strength of the sink circuit controlled based on ON/OFF states of the first sink transistor and the second sink transistor.

2. The gate driver circuit according to claim 1, wherein:
the source transistor is a P-type transistor; and
the first sink transistor and the second sink transistor are N-type transistors.

3. The gate driver circuit according to claim 2, wherein:
the source transistor and the first sink transistor are configured by a first switching signal into complementary ON/OFF states.

4. The gate driver circuit according to claim 3, wherein the second sink transistor is configured by a second switching signal to be in an ON state and an OFF state while the first sink transistor is in an ON state.

5. The gate driver circuit according to claim 4, wherein the first switching signal is a step signal and the second switching signal is a pulse signal.

6. The gate driver circuit according to claim 1, wherein the first sink transistor is a first size and the second sink transistor is a second size, the first size smaller than the second size.

7. The gate driver circuit according to claim 1, wherein the first sink transistor and the second sink transistor are coupled in parallel between the output and the ground.

8. The gate driver circuit according to claim 1, wherein the drive strength of the sink circuit is controllable to:
a low drive strength corresponding to the first sink transistor in an ON state and the second sink transistor in an OFF state; and
a high drive strength corresponding to the first sink transistor in an ON state and the second sink transistor in an ON state.

9. The gate driver circuit according to claim 1, wherein to transition the output from the high voltage to the ground, the first sink transistor remains ON for a switching period while the second sink transistor remains ON for a portion of the switching period.

10. The gate driver circuit according to claim 9, wherein the portion can be adjusted to control the switching period.

11. A method for driving a gate of a power transistor, the method comprising:
to drive the gate to an ON state:
configuring a source transistor to conduct an ON current from a high voltage to the gate; and
to drive the gate to an OFF state:
configuring a first sink transistor ON to conduct a first OFF current from the gate to a ground during a switching period;
configuring a second sink transistor ON to conduct a second OFF current from the gate to the ground to increase a drive strength during a first portion of the switching period, the first sink transistor and the second sink transistor both being ON during the first portion; and
configuring the second sink transistor OFF to not conduct the second OFF current from the gate to the ground to decrease the drive strength during a second portion of the switching period.

12. The method according to claim 11, wherein:
the source transistor is a P-type transistor; and
the first sink transistor and the second sink transistor are N-type transistors.

13. The method according to claim 11, wherein:
configuring the first sink transistor to conduct a first OFF current from the gate to the ground during a switching period includes providing a step signal to the first sink transistor; and
configuring the second sink transistor to conduct a second OFF current from the gate to the ground to increase a drive strength during a first portion of the switching period includes providing a pulse signal to the second sink transistor.

14. The method according to claim 13, wherein:
the switching period has a Miller plateau region that begins after a start of the switching period; and
the pulse signal has a rising edge at the start of the switching period and a falling edge that occurs at the start of the Miller plateau region of the switching period.

15. The method according to claim 11, wherein the first sink transistor is a first size and the second sink transistor is a second size, the first size smaller than the second size.

16. The method according to claim 11, wherein the first sink transistor and the second sink transistor are coupled in parallel between the gate and the ground.

17. The method according to claim 11, further comprising:
adjusting the first portion to control the switching period.

18. A gate driver circuit comprising:
a source circuit including:
a source transistor that can be configured to conduct an ON current from a high voltage to an output; and
a sink circuit including:
a first sink transistor that can be turned ON by a first switching signal to conduct a first OFF current from the output to a ground, and a second sink transistor that can be turned ON and then OFF by a second switching signal while the first sink transistor is ON, the second sink transistor conducting a second OFF current from the output to the ground while the second sink transistor is ON.

19. The gate driver circuit according to claim 18, wherein the first switching signal is a step signal, and the second switching signal is a pulse signal.

20. The gate driver circuit according to claim 18, wherein turning the second sink transistor OFF reduces a driving strength of the gate driver circuit.

* * * * *